(12) United States Patent
Meyer (10) Patent No.: US 8,729,714 B1
(45) Date of Patent: May 20, 2014

(54) FLIP-CHIP WAFER LEVEL PACKAGE AND METHODS THEREOF

(71) Applicant: Thorsten Meyer, Regensburg (DE)

(72) Inventor: Thorsten Meyer, Regensburg (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/731,123

(22) Filed: Dec. 31, 2012

(51) Int. Cl.
*H01L 23/48* (2006.01)
*H01L 23/52* (2006.01)
*H01L 29/40* (2006.01)
*H01L 23/28* (2006.01)

(52) U.S. Cl.
USPC ........... 257/778; 257/686; 257/777; 257/787; 257/783; 257/786

(58) Field of Classification Search
USPC ......... 257/738, 686, 777, 723, 787, 778, 782, 257/783, 786
See application file for complete search history.

(56) References Cited

U.S. PATENT DOCUMENTS

| | | | |
|---|---|---|---|
| 8,350,381 B2* | 1/2013 | Theuss | 257/723 |
| 8,378,452 B2* | 2/2013 | Lee et al. | 257/532 |
| 8,446,017 B2* | 5/2013 | Paek et al. | 257/778 |
| 2008/0116586 A1* | 5/2008 | Kim et al. | 257/778 |
| 2011/0210452 A1* | 9/2011 | Roozeboom et al. | 257/774 |

* cited by examiner

*Primary Examiner* — Matthew Reames
*Assistant Examiner* — Dilinh Nguyen (57) ABSTRACT

An electronic package includes a flip-chip component having a first die coupled to a flip-chip substrate, second die stacked on the first die, an encapsulation compound formed around the first die and the second die, a set of through encapsulant vias (TEVs) providing a set of electrical connections from a first side of the electronic package to a second side of the electronic package through the encapsulation compound to the flip-chip substrate, and a redistribution layer electrically connecting a set of contacts on the second die to the set of TEVs on the first side of the electronic package.

8 Claims, 9 Drawing Sheets

FLIP-CHIP WAFER LEVEL PACKAGE AND METHODS THEREOF

FIELD OF THE DISCLOSURE

This disclosure relates to devices and methods of manufacturing electronics, and more particularly, to electronic packages and manufacturing methods thereof.

BACKGROUND

In manufacturing integrated circuits (ICs), the ICs, called chips or dies, are generally packaged prior to distribution and integration with other electronic assemblies. This packaging usually includes encapsulating the chips in a material and providing electrical contacts on the exterior of the package to provide an interface to the chip. Chip packaging, amongst other things, may provide protection from contaminants, provide mechanical support, disperse heat, and reduce thermo-mechanical stresses.

Because of the relation between IC fabrication and IC packaging, IC packaging also must generally progress with the rapid advancements in the semiconductor industry. In particular, there is an ongoing to desire to package ICs and other electronics to make them smaller, faster, and more reliable.

SUMMARY

In a first aspect of this disclosure, an electronic package includes a flip-chip component having a first die coupled to a flip-chip substrate, second die stacked on the first die, an encapsulation compound formed around the first die and the second die, a set of through encapsulant vias (TEVs) providing a set of electrical connections from a first side of the electronic package to a second side of the electronic package through the encapsulation compound to the flip-chip substrate, and a redistribution layer electrically connecting a set of contacts on the second die to the set of TEVs on the first side of the electronic package.

In another aspect of this disclosure, a method for manufacturing an electronic package is provided. The method includes providing a flip-chip component having a first die coupled to a flip-chip substrate, adhering the first die to a second die, forming an encapsulation compound around the first die and the second die, drilling a set of through encapsulant vias (TEVs) from a first side of the electronic package to the flip-chip substrate located on a second side of the electronic package, filling the set of TEVs with an electrically conductive material, and applying a redistribution layer electrically connecting a set of contacts on the second die to the set of TEVs on the first side of the electronic package.

In a further aspect of this disclosure, a memory device includes a flip-chip component having a first die coupled to a flip-chip substrate, a second die stacked on the first die, an encapsulation compound formed around the first die and the second die, a set of through encapsulant vias (TEVs) providing a set of electrical connections from a first side of the electronic package to a second side of the electronic package through the encapsulation compound to the flip-chip substrate, and a redistribution layer electrically connecting a set of contacts on the second die to the set of TEVs on the first side of the electronic package. The first die and/or the second die includes a memory function.

In yet another aspect of this disclosure, an electronic package includes a first electronic package, and a second electronic package. The second electronic package includes a flip-chip component having a first die coupled to a flip-chip substrate, a second die stacked on the first die, an encapsulation compound formed around the first die and the second die, a set of through encapsulant vias (TEVs) providing a set of electrical connections from a first side of the electronic package to a second side of the electronic package through the encapsulation compound to the flip-chip substrate, and a redistribution layer electrically connecting a set of contacts on the second die to the set of TEVs on the first side of the electronic package. The first electronic package is stacked together with the second electronic package to form a package-on-package (PoP) electronic package.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

Chips (alternatively referred to herein as dies) are generally packaged prior to distribution and integration with other electronic assemblies. This packaging usually includes encapsulating the chips in a material and providing electrical contacts on the exterior of the package to provide an interface to the chip. Chip packaging, amongst other things, may provide protection from contaminants, provide mechanical support, disperse heat, and reduce thermo-mechanical stresses.

Stacking multiple chips within a single chip package is an increasingly common packaging requirement in order to reduce, for example, overall assembly size, functional circuit speed, and overall costs.

Figure 1:
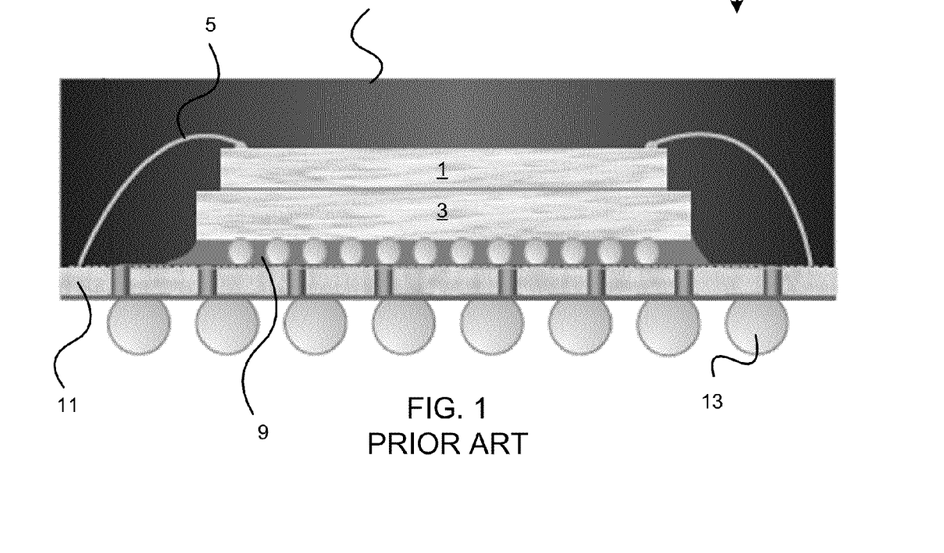
FIG. 1 is a flip-chip wire-bond package.

FIG. 1 is a flip-chip wire-bond package 10. Flip-chip wire-bond package 10 includes two chips 1, 3, arranged such that chip 1 is stacked on top of chip 3. Chip 3 is coupled to a layered substrate 11 by way of bump-underfill layer 9. Layered substrate 11 is in turn coupled to solder balls 13. In this way, chip 3 is indirectly coupled, both physically and electrically, to some of the solder balls 13 such that a subset of solder balls 13 form an electrical interface for chip 3. Chip 1 is likewise electrically coupled to the layered substrate 11 by way of bonded wires 5. In this way, chip 1 is indirectly electrically coupled to some of solder balls 13 such that a subset of solder balls 13 forms an electrical interface for chip 1. Encapsulation compound 7 is molded around the chips 1, 3, the wire bonds 5, and the bump-underfill layer 9. Encapsulation compound 7 is generally formed on top of layered substrate 11. In this way flip-chip wire-bond package 10 forms a unitary package with an interface provided by way of solder balls 13.

While flip-chip wire-bond package 10, and other wire bond packaging, provides a means for package production, ongoing advancements in the industry have pushed towards lower package profiles and increased electrical performance.

Through Silicon Vias (TSVs) provide a connection through the semiconductor wafer for stacking purposes. TSVs may provide better electrical performance and a lower profile. Costs and reliable supply chain management, however, may generally limit widespread TSV usage within industry.

Figure 2:
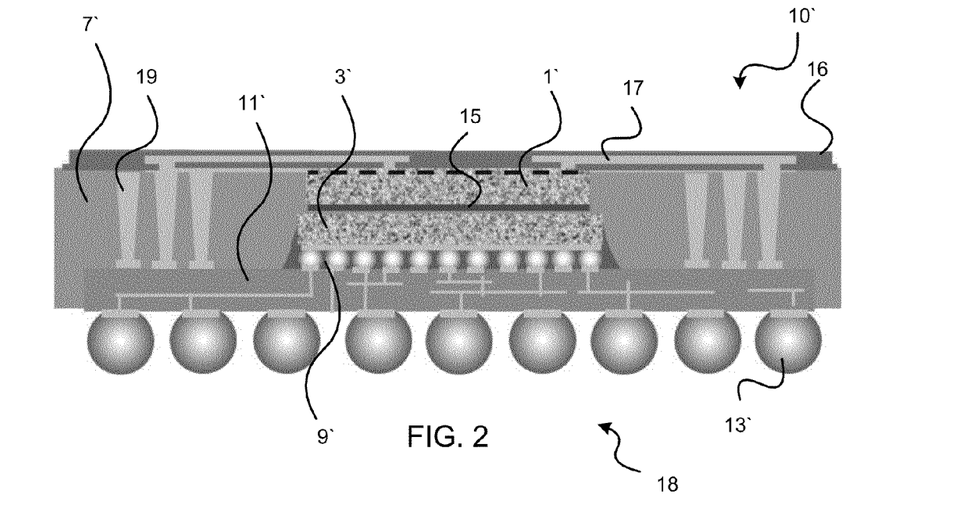
FIG. 2 is a flip-chip wafer-level package.

FIG. 2 is a flip-chip wafer-level package 10'. Flip-chip wafer-level package 10' includes a flip-chip component 18 which includes die 3' coupled to flip-chip substrate 11'. As shown, die 3' is coupled to flip-chip substrate 11' by way of bump-underfill layer 9'.

Die 1' is arranged on top of die 3', and encapsulation compound 7' is formed around die 1' and die 3'. Die 1' may be adhered to die 3 prior to forming encapsulation compound 7' by applying an adhesive 15 such as a die attach film (DAF) between dies 1' and 3'. Adhesive 15 may be applied, for example, through laminating, printing, or dispensing the adhesive onto one of the dies and then placing the remaining die onto the adhesive prior to curing.

A set of through encapsulant vias (TEVs) 19 provide electrical connections through the encapsulation compound 7' of flip-chip wafer-level package 10'. Additionally, a redistribution layer 17 electrically connects TEVs 19 to die 1'. Flip-chip wafer-level package 10' further includes solder balls 13' adhered to the flip-chip substrate 11', and possibly a protection layer 16 covering redistribution layer 17 and the TEVs 19 to protect the otherwise exposed components 16'. Flip-chip wafer-level package 10' may also include a dielectric layer between the second die and the redistribution layer.

Dies 1' and 3' may be fabricated according to standard semiconductor manufacturing processes. That is, generally after an ingot is grown it is sliced into wafers. Areas of the wafer may undergo deposition, removal, patterning, and doping processes. Once the wafer has been processed, the wafer is generally mounted and diced into individual dies. Die 3', in particular, is further processed and provided as part of the flip-chip component 18. That is, die 3' is processed using flip-chip technology such that die 3' is coupled to flip-chip substrate 11' thereby forming the flip-chip component 18.

Encapsulation compound 7' is generally composed of a plastic material, but other materials, such as ceramics and metals and silicon or glass, may be used if desired. Thermosetting molding compounds, in particular, are a type of plastic material based on epoxy resins. These types of compounds have historically been used in electronic packaging applications. Thermoplastics, such as a high purity fluoropolymer, are another type of plastic materials which may be used as encapsulation compound 7'.

TEVs 19 are formed by drilling holes through encapsulation compound 7' and then filling the drilled holes with an electrically conductive material. The drilling of the TEVs holes may be performed, for example, with a mechanical drill, a laser, or through chemical etching.

Contacts on die 1' may be arranged in a variety of ways. As depicted in FIG. 2, however, die 1' is arranged such that its contacts are arranged opposite of contacts on die 3'. In this way, redistribution layer 17 can be applied directly over die 1' and thereby connect to the contacts on die 1'. Redistribution layer 17 is preferably applied using thin-film technology. Thin-film deposition can be effectuated, for example, via sputtering, plating, or chemical vapor deposition (CVD), amongst other techniques.

Electronic packages built in accordance with flip-chip wafer-level package 10' may further include, or be combined with, one or more of the following features. Die 1' and/or die 3' may include a memory function. For example, flip-chip wafer-level package 10' may implement dynamic random access memory (DRAM). An electronic package may include a first electronic package and a second electronic package, at least one of which is built in accordance with flip-chip wafer-level package 10'; the first electronic package may be stacked together with the second electronic package to form a package-on-package (PoP) electronic package. In this way, dies 1' and 3' as depicted in FIG. 1 are substituted with the first and second electronic packages, while the remaining structure of flip-chip wafer-level package 10' remains relatively the same.

Flip-chip wafer-level package 10' may include additional dies stacked on die 3' of the flip-chip component 18. That is, flip-chip wafer-level package 10', in addition to dies 1' and 3', may include more dies, such that the total number of dies in flip-chip wafer-level package 10' is three or more.

Flip-chip wafer-level package 10' may be constructed such that the distance between the set of contacts on the second die and a surface of the first side of the electronic package is less than about 20 µm. Such a configuration reduces package size and may reduce overall electronic assembly size.

Figure 3:
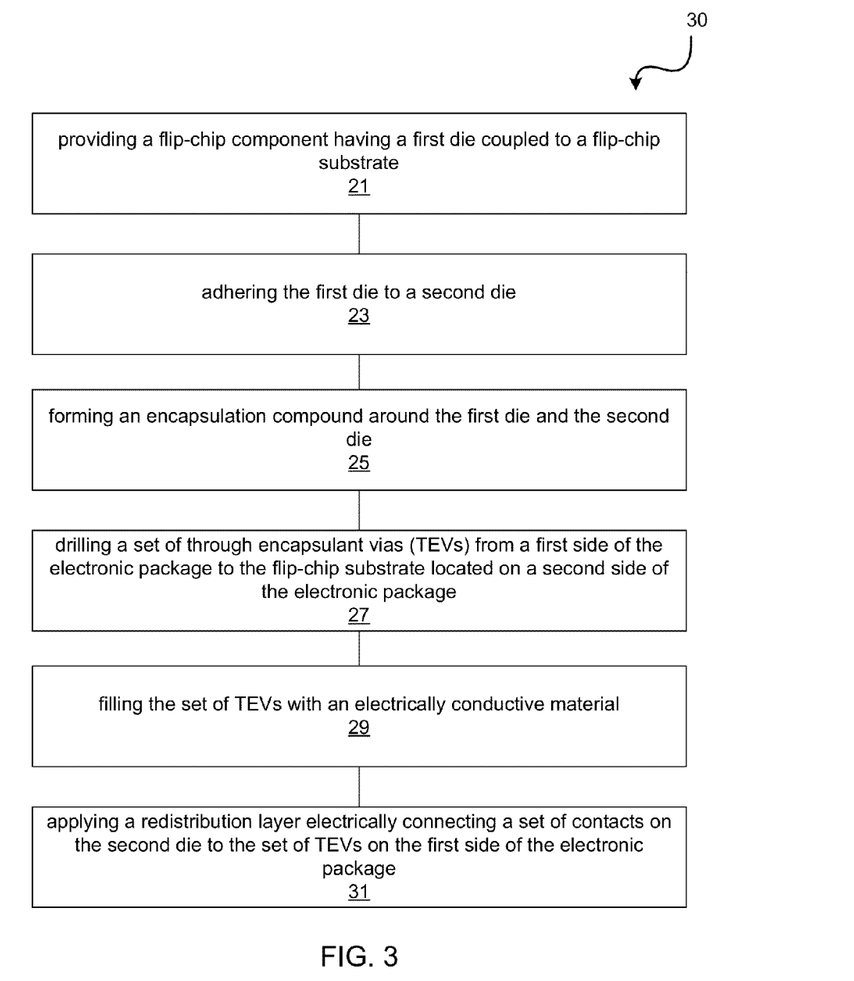
FIG. 3 illustrates a method for manufacturing the flip-chip wafer-level package shown in FIG. 2.

Further details regarding the manufacturing of wafer-level package 10' are discussed below with reference in particular to FIGS. 3-23. FIG. 3 illustrates a method for manufacturing the flip-chip wafer-level package shown in FIG. 2, while FIGS. 4-13 depict a process flow for manufacturing the flip-chip wafer-level package 10' shown in FIG. 2, and FIGS. 14-23 depict an alternative process flow for manufacturing the flip-chip wafer-level package 10' shown in FIG. 2.

Figure 4:
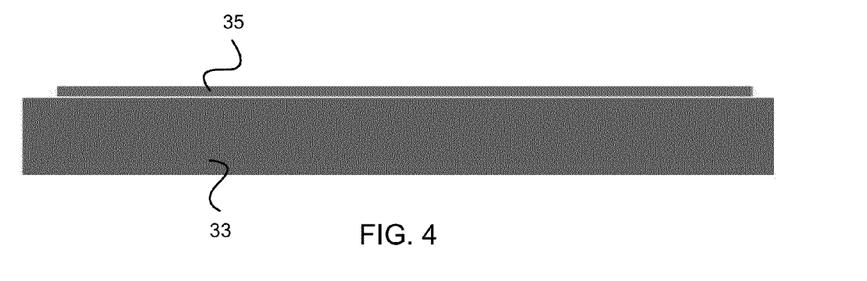
FIGS. 4-13 depict a process flow for manufacturing the flip-chip wafer-level package shown in FIG. 2.

Referencing FIG. 3, a method 30 for manufacturing an electronic package is provided. In FIG. 4, a mold carrier 33 with releasable tape 35 is provided. For example, an adhesive foil may be used as releasable tape 35 and applied thereon to mold carrier 33, e.g. by lamination.

Figure 5:
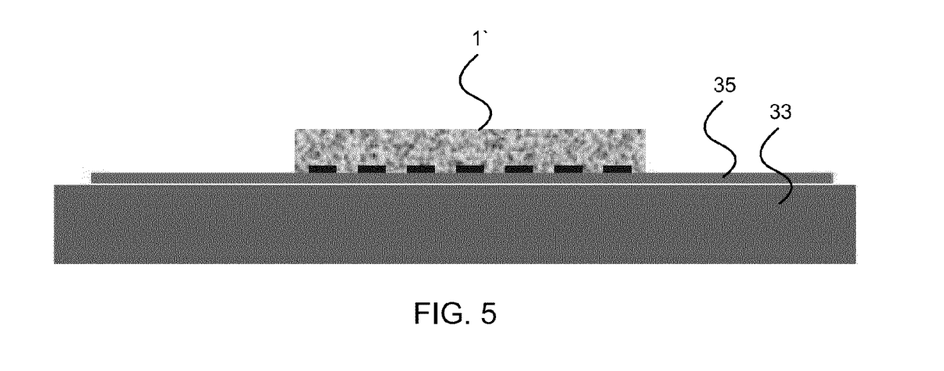

In FIG. 5, die 1' is adhered to mold carrier 33 by way of releasable tape 35. Preferably, die 1' is placed face down on releasable tape 35. That is, die 1' is arranged such that the electrical contacts thereon are directed towards the mold carrier 33. Dies 1' and 3' may be fabricated according to standard semiconductor manufacturing processes. That is, generally after an ingot is grown it is sliced into wafers. Areas of the wafer may undergo deposition, removal, patterning, and doping processes. Once the wafer has been processed, the wafer is generally mounted and diced into individual dies. Die 3', in particular, is further processed and provided as part of the flip-chip component 18. That is, die 3' is processed using flip-chip technology such that die 3' is coupled to flip-chip substrate 11' thereby forming the flip-chip component 18.

Figure 6:
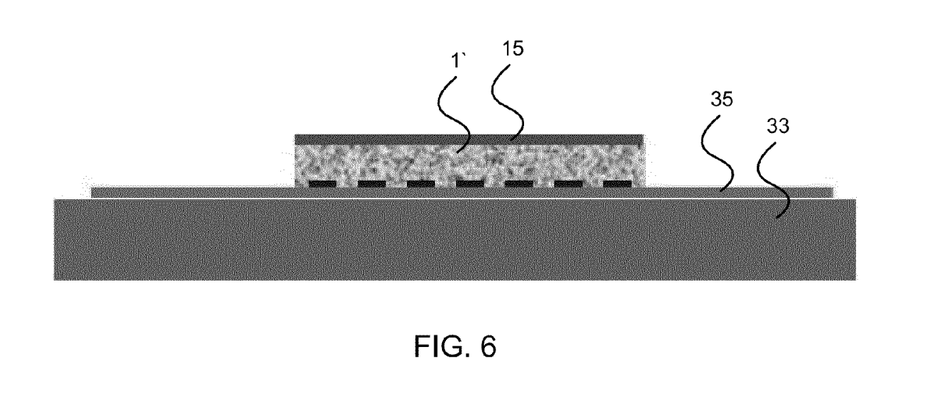

In FIG. 6, adhesive 15 is then applied to a side of die 1'. Preferably, adhesive 15 is applied on the side of die 1' opposite to the side of die 1' adhered to mold carrier 33', or put more simply, adhesive 15 is preferably applied to the back side of die 1'. Die 1' may be adhered to die 3 by applying an adhesive 15 such as a die attach film (DAF) between dies 1' and 3'. Adhesive 15 may be applied, for example, through laminating, printing, or dispensing the adhesive.

Figure 7:
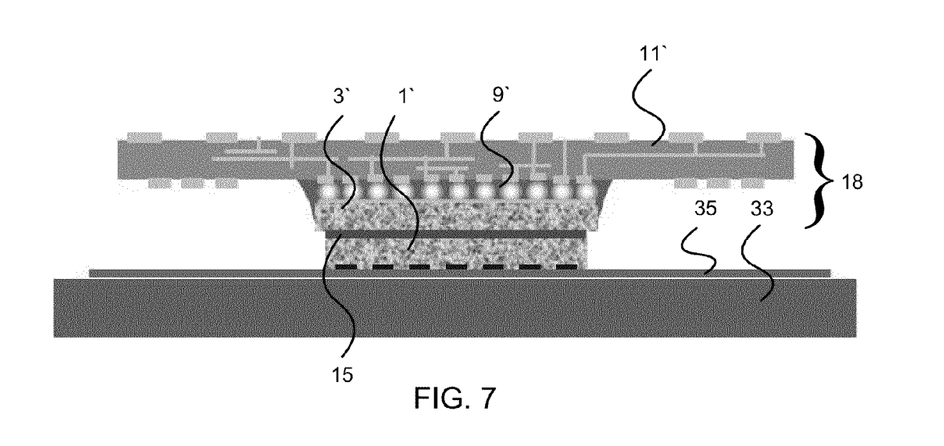

Method 30 then includes, as shown in FIG. 7, providing 21 a flip-chip component 18 having die 3' coupled to flip-chip substrate 11', and adhering 23 die 3' to die 1'. Since, as discussed above with reference to FIG. 6, the back side of die 1' already has adhesive 15 applied thereto, die 3' may be adhered to die 1' by way of the previously provided adhesive 15. In this way, flip-chip component 18 is adhered to mold carrier 33 by the adherence of dies 1' and 3'. If necessary, adhesive 15 may be cured by the addition of energy. For example, chemical, thermal, or ultraviolet (UV) light may be added to cure adhesive 15.

Figure 8:
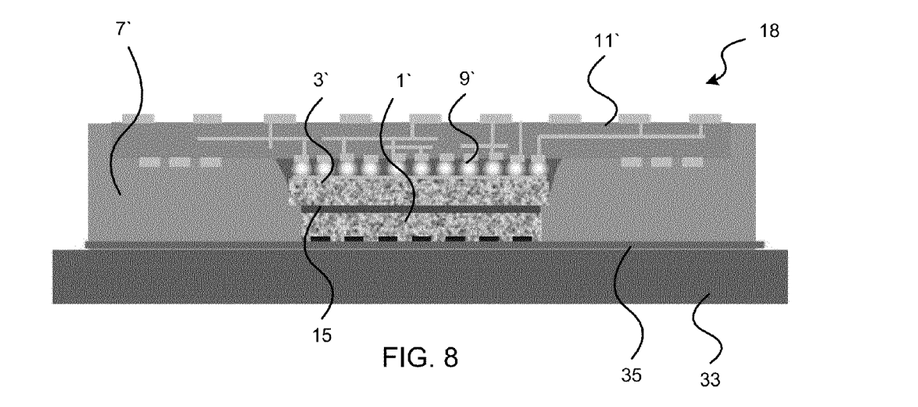

Method 30 further includes, as shown in FIG. 8, forming 25 encapsulation compound 37 around dies 1' and 3'. Encapsulation compound 7' is generally composed of a plastic material, but other materials, such as ceramics and metals, may be used if desired. Thermosetting molding compounds, in particular, are a type of plastic material based on epoxy resins. These types of compounds have historically been used in electronic packaging applications. Thermoplastics, such as a high purity fluoropolymer, are another type of plastic materials which may be used as encapsulation compound 7'. It is noted that an exposed side of flip-chip substrate 11' may be left uncovered with encapsulation compound 7'. In order to not cover flip-chip substrate 11' with encapsulation compound 7', a top foil in a compression molding tool may be used or injection molding technology may be employed. Another possibility would be to grind the attached mold compound down to the substrate contacts after molding.

Figure 9:
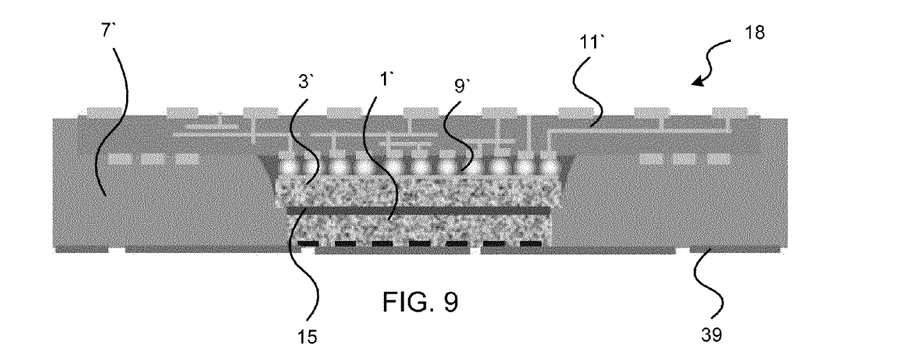

In FIG. 9, mold carrier 33 is released after encapsulation compound 37 has been formed. As part of releasing mold carrier 33, adhesive 35 may also be removed, and a dielectric layer 39 may be applied and structured. Application of dielectric layer 39 may be performed, for example, by spin coating and photolithography, or by lamination and laser structuring. Dielectric layer 39 may also be applied later on, or can be structured contemporaneously with TEV drilling.

Figure 10:
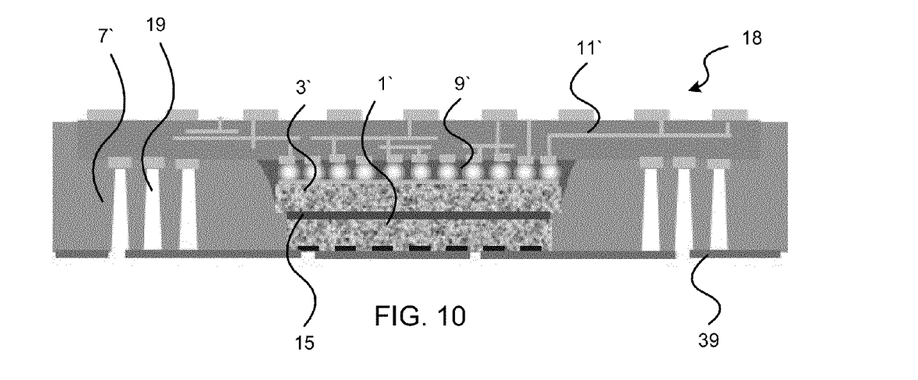
Figure 11:
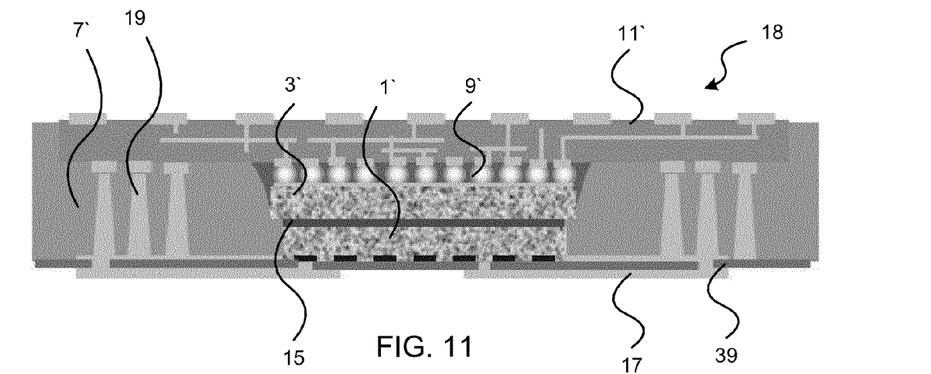

Method 30 further includes drilling 27, as shown in FIG. 10, a set of through encapsulant vias (TEVs) 19 from a first side of the electronic package to flip-chip substrate 11' located on a second side of the electronic package. TEVs 19 are formed by drilling holes through encapsulation compound 7' and possibly the dielectric material, if not previously structured, as shown in FIG. 10, and then filling the drilled holes with an electrically conductive material, as shown in FIG. 11. The drilling of the TEVs holes may be performed, for example, with a mechanical drill, a laser, or through chemical etching. In performing the drilling, via stops on flip-chip substrate 11' may be used to provide a stopping point for the drilling.

Method 30 then includes, as shown in FIG. 11, filling 29 TEVs 19 with an electrically conductive material, and applying 31 redistribution layer 17, thereby electrically connecting a set of contacts on die 1' to TEVs 19 on a first side of the electronic package 10'. Filling 29 the TEVs 19 with an electrically conductive material, and applying 31 redistribution layer 17, may be performed in distinct parts, or may occur contemporaneously in a single step. Redistribution layer 17 electrically connects TEVs 19 with solder ball positions and may also provide on-chip connections and connections between multiple chips in a given plane.

Figure 12:
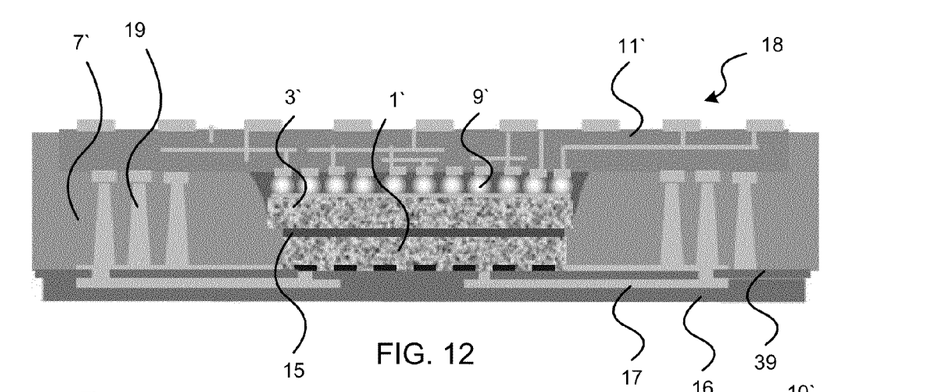

In FIG. 12, a solder stop or back side protection (BSP) such as protection layer 16 may be applied on top of redistribution layer 17, thereby giving the electronic package 10' a consistent black backside, protecting redistribution layer 17, and protecting the TEVs 19, for example. This solder stop or BSP may be applied using a spin-coating, lamination, spray coating or printing process.

Figure 13:
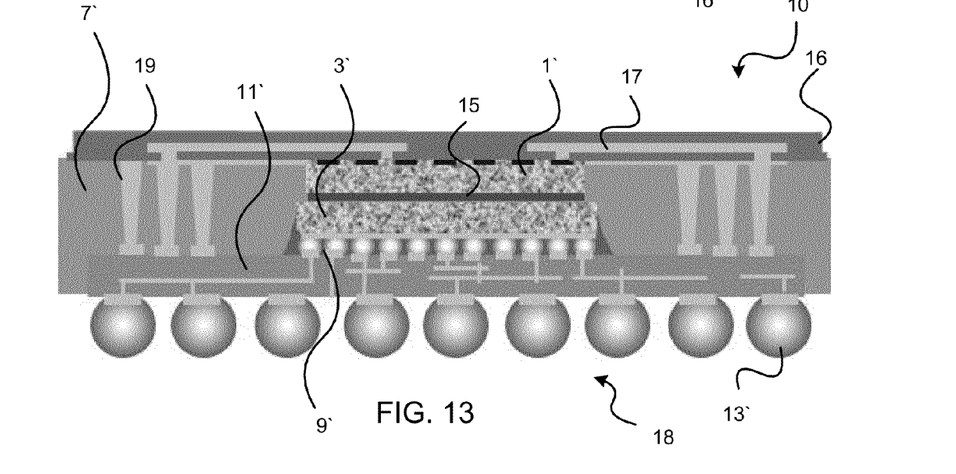

Finally, in FIG. 13, solder balls 13' are applied or adhered to flip-chip substrate 11' and the individual packages, if not already separated, may be separated at this point. Solder balls 13' may be conventional solder balls, semi-balls, polymer core balls or land grid arrays (LGA), for example, and may be adhered, for instance, via soldering thereto.

In addition to producing a smaller, more efficient package, flip-chip wafer-level package 10' allows for separately testing and burning-in flip-chip component 18 between fabrication processes. That is, flip-chip component 18 may be separately fabricated, tested, and burned-in, prior to continuing manufacture of flip-chip wafer-level package 10'.

Figure 14:
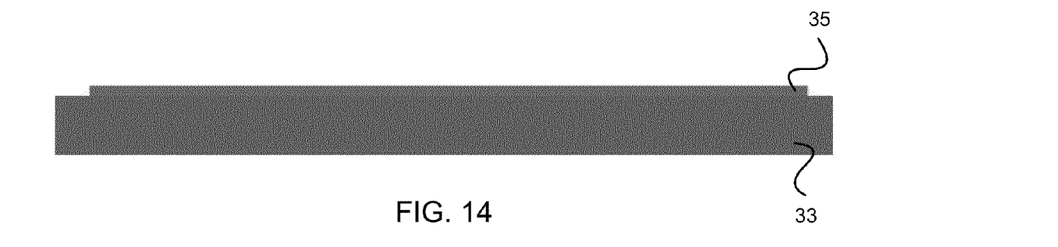
FIGS. 14-23 depict an alternative process flow for manufacturing the flip-chip wafer-level package shown in FIG. 2.

Referencing FIGS. 14-23, an alternative process flow is shown. In FIG. 14, a mold carrier 33 with releasable tape 35 is provided. That is, releasable tape 35 is applied to mold carrier 33. For example, an adhesive foil may be used as releasable tape 35 and laminated thereon to mold carrier 33.

Figure 15:
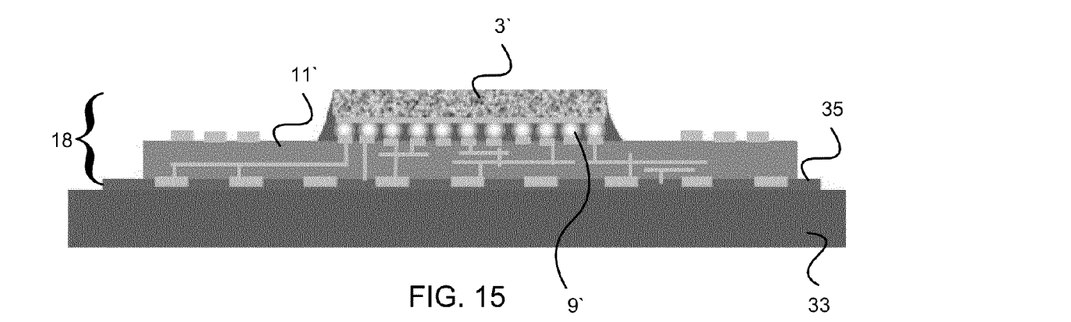

In FIG. 15, flip-chip component 18 is adhered to mold carrier 33 via the previously applied releasable tape 35. More particularly, flip-chip substrate 11' is adhered to mold carrier 33 via releasable tape 35.

Figure 16:
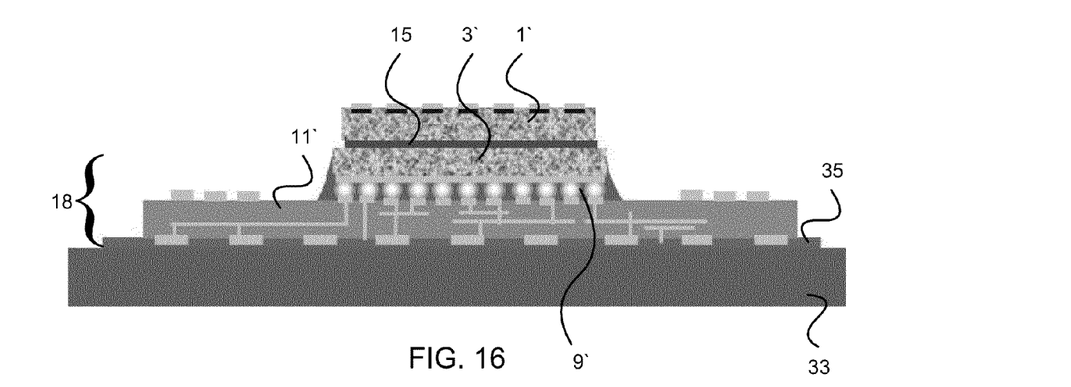

Similar to the process flow heretofore described, in FIG. 16, die 1' is then attached to die 3' by way of adhesive 15. Adhesive 15 is applied to a side of die 3', or alternatively die 1'. Preferably, adhesive 15 is applied on the side of die 3' opposite to the side of die 3' adhered to flip-chip substrate 11', or put more simply, adhesive 15 is preferably applied to the back side of die 3'. Die 1' may be adhered to die 3' by applying an adhesive 15 such as a die attach film (DAF) between dies 1' and 3'. Adhesive 15 may be applied, for example, through laminating, printing, or dispensing the adhesive. Dies 1' and 3' are then adhered together by way of the previously applied adhesive 15. In this way, die 1' is adhered to mold carrier 33 by the adherence of dies 1' and 3'. If necessary, adhesive 15 may be cured by the addition of energy. For example, chemical, thermal, or ultraviolet (UV) light may be added to cure adhesive 15. Preferably, dies 1' and 3' are positioned as shown such that the respective contacts are opposite one another.

Figure 17:
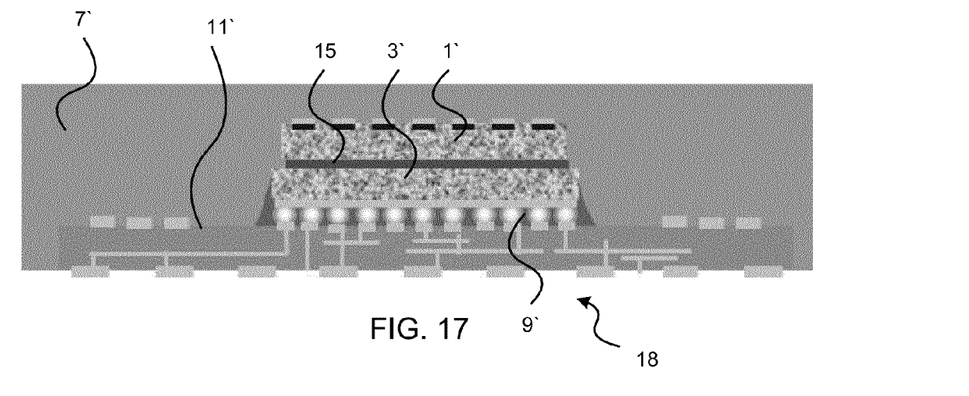

As shown in FIG. 17, encapsulation compound 7' is formed on and around dies 1' and 3', and mold carrier 33 is removed along with removable adhesive 35. Encapsulation compound 7' is generally composed of a plastic material, but other materials, such as ceramics and metals, may be used if desired. Thermosetting molding compounds, in particular, are a type of plastic material based on epoxy resins. These types of compounds have historically been used in electronic packaging applications. Thermoplastics, such as a high purity fluoropolymer, are another type of plastic materials which may be used as encapsulation compound 7'.

Figure 18:
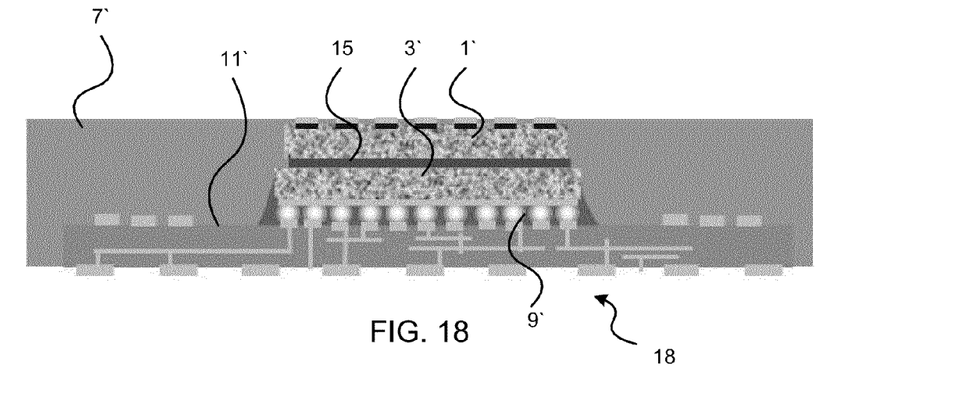

In FIG. 18, the contacts, or applied posts of die 1' may then exposed by, for example, grinding encapsulation compound 37 until the posts are exposed and encapsulation compound 7' forms a substantially planner surface with the surface of die 1'. Alternatively, the contacts, or applied posts, may be exposed by laser drilling through encapsulation compound 7'. As a further option, the side of die 1' having the contacts may be left relatively uncovered with encapsulation compound 7'. In order to not cover flip-chip substrate 11' with encapsulation compound T, a top foil in a compression molding tool may be used or injection molding technology may be employed.

Figure 19:
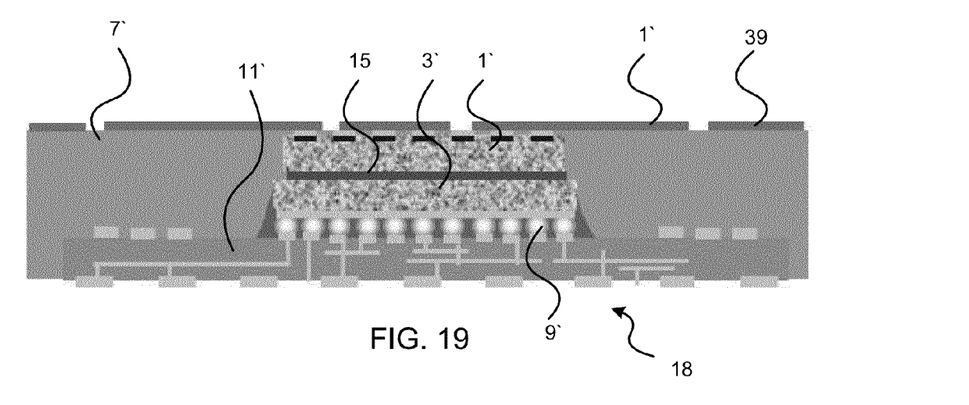

In FIG. 19, dielectric layer 39 is applied and at least partly structured. Application of dielectric layer 39 may be performed, for example, by spin coating, or by lamination and laser structuring. Dielectric layer 39 may also be applied later on, or can be structured contemporaneously with TEV drilling.

Figures 20, 21:
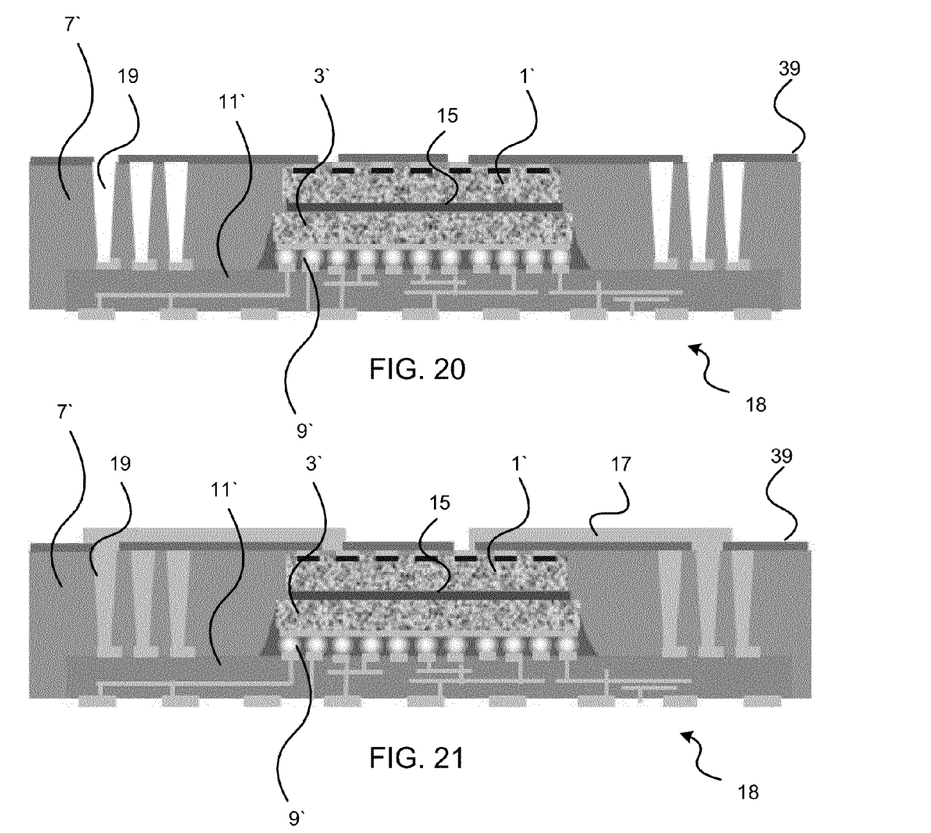

In FIG. 20, TEVs 19 are drilled, and in FIG. 21, they filled with an electrically conductive material. The TEVs 19 proceed from a first side of the electronic package to flip-chip substrate 11' located on a second side of the electronic package. TEVs 19 are formed by drilling holes through encapsulation compound 7' and possibly the dielectric layer 39, and then filling the drilled holes with an electrically conductive material. The drilling of the TEVs holes may be performed, for example, with a mechanical drill, a laser, or through chemical etching. In performing the drilling, via stops on flip-chip substrate 11' may be used to provide a stopping point for the drilling.

In FIG. 21, redistribution layer 17 is applied to electrically connect TEVs 19 to die 1'. Filling 29 the TEVs 19 with an electrically conductive material, and applying 31 redistribution layer 17, may be performed in distinct parts, or may occur contemporaneously in a single step. Redistribution layer 17 electrically connects TEVs 19 with solder ball positions and may also provide on-chip connections and connections between multiple chips in a given plane.

Figure 22:
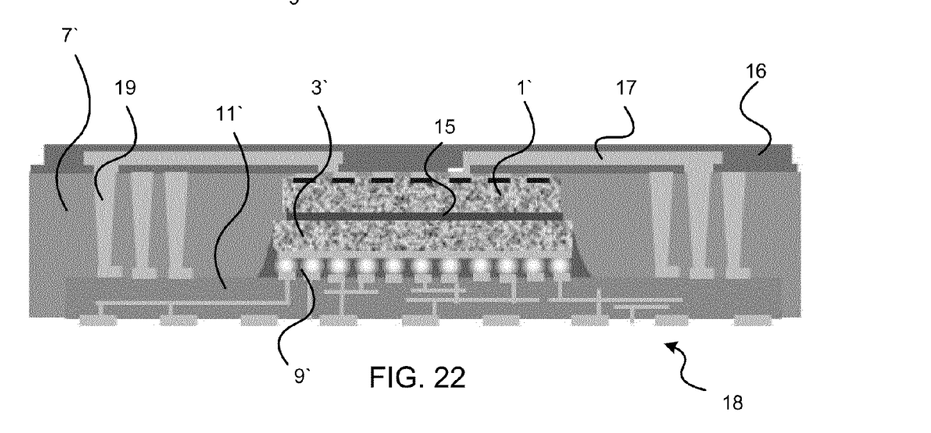

In FIG. 22, a solder stop or back side protection (BSP) such as protection layer 16 may be applied on top of redistribution layer 17, thereby giving the electronic package 10' a consistent black backside, protecting redistribution layer 17, and protecting the TEVs 19, for example. This solder stop or BSP may be applied using a spin-coating, lamination, or printing process.

Figure 23:
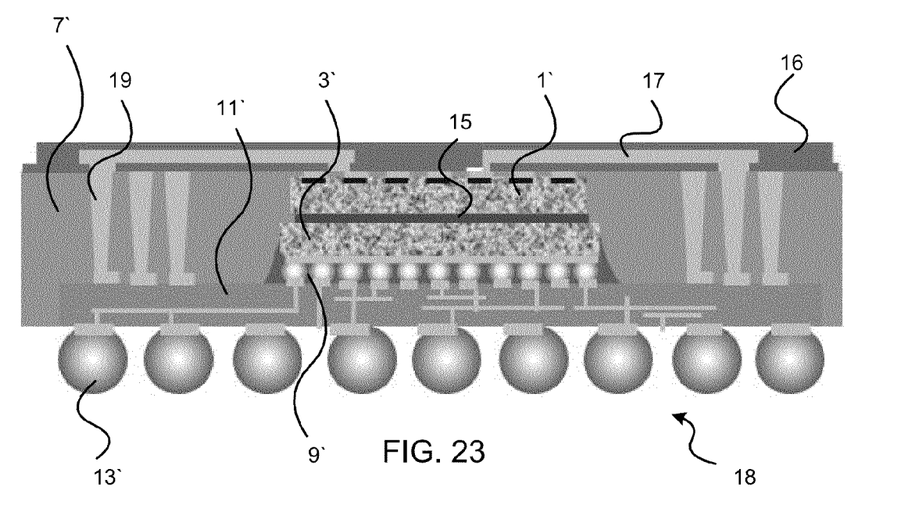

Finally, in FIG. 23, solder balls 13' are applied or adhered to flip-chip substrate 11', and if not yet separated, the individual packages may be separated at this point. As discussed above, solder balls 13' may, for example, be conventional solder balls, semi-balls, or land grid arrays (LGA), and may be adhered, for instance, via soldering thereto.

Figure 24:
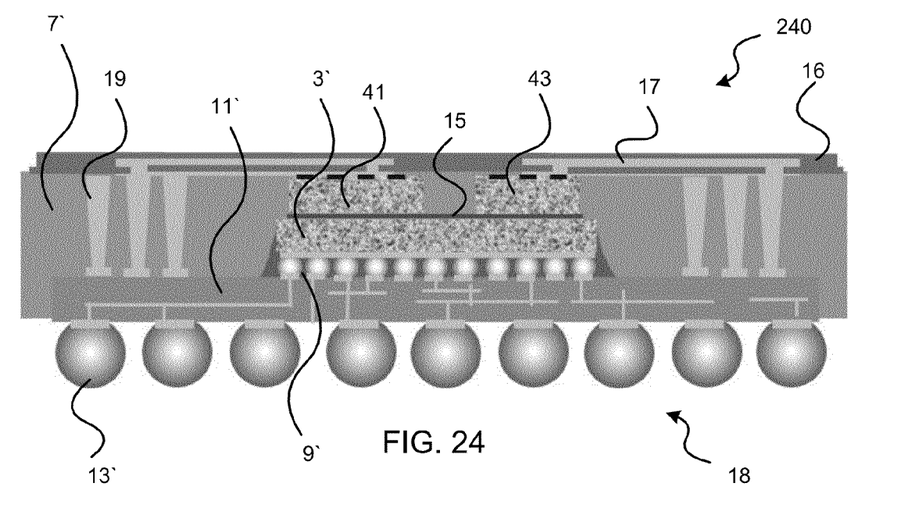
FIG. 24 is a flip-chip wafer-level package with a three chip configuration.

Additional dies may be configured in accordance with the above description. For example, as shown in FIG. 24, flip-chip wafer-level package 240 may be constructed such that dies 41 and 43 are stacked together with die 3'. In this manner, a plurality of dies may be introduced in such an electronic package. In particular, rather than adhering a single die to die 3' via adhesive 15, multiple dies may be adhered thereto.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. An electronic package comprising:
   a flip-chip component having a first die coupled to a flip-chip substrate;
   a second die stacked on the first die;
   an encapsulation compound formed around the first die and the second die;
   a set of through encapsulant vias (TEVs) providing a set of electrical connections from a first side of the electronic package to a second side of the electronic package through the encapsulation compound to the flip-chip substrate;
   a redistribution layer electrically connecting a set of contacts on the second die to the set of TEVs on the first side of the electronic package;
   a protection layer consistently and continuously covering at least a surface of the redistribution layer facing away from the flip-chip substrate; and
   a plurality of solder balls adhered to a single side of the electronic package at a surface of the flip-chip substrate facing away from the first die.

2. The electronic package in claim 1, further comprising a set of additional dies stacked on the first die of the flip-chip component.

3. The electronic package in claim 1, wherein a set of contacts of the first die are arranged opposite of the set of contacts of the second die.

4. The electronic package in claim 1, wherein the redistribution layer is a thin film layer.

5. The electronic package in claim 1, wherein the distance between the set of contacts on the second die and a surface of the first side of the electronic package is less than about 20 μm.

6. The electronic package in claim 1, further comprising a dielectric layer between the second die and the redistribution layer.

7. A memory device comprising:
   a flip-chip component having a first die coupled to a flip-chip substrate;
   a second die stacked on the first die;
   an encapsulation compound formed around the first die and the second die;
   a set of through encapsulant vias (TEVs) providing a set of electrical connections from a first side of the electronic package to a second side of the electronic package through the encapsulation compound to the flip-chip substrate; and
   a redistribution layer electrically connecting a set of contacts on the second die to the set of TEVs on the first side of the electronic package;
   a protection layer consistently and continuously covering at least a surface of the redistribution layer facing away from the flip-chip substrate; and
   a plurality of solder balls adhered to a single side of the electronic package at a surface of the flip-chip substrate facing away from the first die,
   wherein at least one of the group consisting of the first die and the second die includes a memory function.

8. An electronic package comprising:
   a first electronic package; and
   a second electronic package comprising:
      a flip-chip component having a first die coupled to a flip-chip substrate;
      a second die stacked on the first die;
      an encapsulation compound formed around the first die and the second die;
      a set of through encapsulant vias (TEVs) providing a set of electrical connections from a first side of the electronic package to a second side of the electronic package through the encapsulation compound to the flip-chip substrate; and
      a redistribution layer electrically connecting a set of contacts on the second die to the set of TEVs on the first side of the electronic package;
   a protection layer consistently and continuously covering at least a surface of the redistribution layer facing away from the flip-chip substrate; and
   a plurality of solder balls adhered to a single side of the electronic package at a surface of the flip-chip substrate facing away from the first die,
   wherein the first electronic package is stacked together with the second electronic package to form a package-on-package (PoP) electronic package.

* * * * *